(12) United States Patent
Kitajima

(10) Patent No.: US 8,963,652 B2
(45) Date of Patent: Feb. 24, 2015

(54) DUPLEXER AND CIRCUIT MODULE INCLUDING THE SAME

(71) Applicant: Murata Manufacturing Co., Ltd., Nagaokakyo-shi, Kyoto-fu (JP)

(72) Inventor: Hiromichi Kitajima, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/058,696

(22) Filed: Oct. 21, 2013

(65) Prior Publication Data

US 2014/0043112 A1    Feb. 13, 2014

Related U.S. Application Data

(63) Continuation of application No. PCT/JP2012/002742, filed on Apr. 20, 2012.

(30) Foreign Application Priority Data

Apr. 22, 2011    (JP) .................................. 2011-095699

(51) Int. Cl.
| | | |
|---|---|---|
| *H03H 7/46* | (2006.01) | |
| *H01P 5/12* | (2006.01) | |
| *H04B 1/52* | (2006.01) | |
| *H03H 9/05* | (2006.01) | |
| *H03H 9/72* | (2006.01) | |

(52) U.S. Cl.
CPC .. *H01P 5/12* (2013.01); *H04B 1/52* (2013.01); *H03H 9/0542* (2013.01); *H03H 9/0547* (2013.01); *H03H 9/0576* (2013.01); *H03H 9/725* (2013.01)
USPC .......................................... 333/132; 333/133

(58) Field of Classification Search
USPC ................................. 333/132, 133, 193–196
See application file for complete search history.

(56) References Cited

U.S. PATENT DOCUMENTS

2006/0132260 A1    6/2006    Iwamoto et al.
2007/0222540 A1    9/2007    Nishigaki et al.
(Continued)

FOREIGN PATENT DOCUMENTS

JP    06-097761 A    4/1994
JP    2001-127589 A    5/2001
(Continued)

OTHER PUBLICATIONS

Official Communication issued in International Patent Application No. PCT/JP2012/002742, mailed on Jul. 24, 2012.

*Primary Examiner* — Robert Pascal
*Assistant Examiner* — Kimberly Glenn
(74) *Attorney, Agent, or Firm* — Keating and Bennett, LLP

(57) ABSTRACT

In a duplexer, a common terminal is arranged in a central region of a back surface of a main body of the duplexer, a transmission terminal and a reception terminal are arranged on a virtual line that is parallel or substantially parallel with one side of the back surface of the main body and that passes through the common terminal such that the common terminal is sandwiched between the transmission terminal and the common terminal. By arranging a plurality of the duplexers such that the transmission terminals are aligned and the reception terminals are aligned, the common terminals, the transmission terminals, and the reception terminals provided on the respective duplexers are not spaced apart from one another.

17 Claims, 7 Drawing Sheets

(56) References Cited

U.S. PATENT DOCUMENTS

| | | |
|---|---|---|
| 2008/0290965 A1* | 11/2008 | Pitschi et al. .................. 333/133 |
| 2009/0071711 A1 | 3/2009 | Takano et al. |
| 2009/0174497 A1 | 7/2009 | Korden |
| 2010/0026414 A1 | 2/2010 | Iwaki et al. |
| 2010/0207704 A1 | 8/2010 | Pitschi et al. |

FOREIGN PATENT DOCUMENTS

| | | |
|---|---|---|
| JP | 2001-144583 A | 5/2001 |
| JP | 2003-163569 A | 6/2003 |
| JP | 2006-180192 A | 7/2006 |
| JP | 2007-142812 A | 6/2007 |
| JP | 2007-195145 A | 8/2007 |
| JP | 2007-243989 A | 9/2007 |
| JP | 2007-259296 A | 10/2007 |
| JP | 2009-517897 A | 4/2009 |
| JP | 2009-544201 A | 12/2009 |
| JP | 2010-041097 A | 2/2010 |
| JP | 2010-068079 A | 3/2010 |
| JP | 2010-541358 A | 12/2010 |
| WO | 2009/043825 A1 | 4/2009 |

* cited by examiner

DUPLEXER AND CIRCUIT MODULE INCLUDING THE SAME

BACKGROUND OF THE INVENTION

1. Field of the Invention

The present invention relates to duplexers including a first filter and a second filter having different frequency bands, and to circuit modules including a duplexer.

2. Description of the Related Art

To date, for example, a duplexer is formed in such a manner that a transmission filter element defining a transmission filter and a reception filter element defining a reception filter are mounted in a cavity provided in a rectangular ceramic package in plan view, and the cavity in which the transmission filter element and the reception filter element have been arranged is hermetically sealed with a cap. Referring to FIG. 12, a back surface 501 of a duplexer 500 includes thereon a transmission terminal 502 for inputting a transmission signal to the transmission filter from the mounting substrate side of a circuit module in which the duplexer 500 is mounted, and reception terminals 503 for outputting a reception signal from the reception filter to the mounting surface side, a common terminal 504 (antenna terminal) connected to the output side of the transmission filter and the input side of the reception filter, and ground terminals 505.

In the example illustrated in FIG. 12, the common terminal 504 is arranged at a position adjacent to the substantial center of one long side among the two opposing long sides of the back surface 501 of the duplexer 500, and the transmission terminal 502 and the reception terminals 503 are arranged in the corner portions at the two ends of the other long side, thereby substantially forming a V-shaped arrangement. Ground terminals 505 are arranged along the sides of the back surface 501 of the duplexer 500.

It should be noted that FIG. 12 is a diagram illustrating the arrangement of the terminals of the existing duplexer 500. In the example illustrated in FIG. 12, since a reception filter is formed of an unbalanced/balanced-type reception filter element, two of the reception terminals 503 for the reception filter are provided on the back surface 501 of the duplexer 500.

In recent years, mobile communication terminals such as cellular phones and mobile information terminals that support communication based on a plurality of communication standards, for example, the Global System for Mobile Communication (GSM) standard and the Code Division Multiple Access (CDMA) standard, have rapidly become popular. These mobile communication terminals, which perform transmission and reception of signals in different frequency bands using a common antenna, need to have a duplexer that separates a transmission signal and a reception signal having different frequencies for each of the supported communication standards, when communication based on a plurality of communication standards is to be supported. Hence, various front-end modules (circuit modules) that support communication based on a plurality of communication standards have been provided, such as, for example, an antenna switch module in which a switch IC and a plurality of duplexers are arranged on a mounting substrate.

A circuit module that supports communication based on a plurality of communication standards is used in such a manner as to be mounted on a motherboard provided in a mobile communication terminal. In general, the shapes of electrode patterns for mounting a circuit module to be mounted on the motherboard are different among mobile communication terminals. In many cases, the arrangement of mounting electrodes, provided on the circuit module, used for mounting the circuit module on the motherboard is designed for each type of mobile communication terminal in accordance with requests from customers. Hence, the arrangement of a plurality of duplexers 500 on the mounting substrate of the circuit module is also designed in accordance with the arrangement of the mounting electrodes used for mounting the circuit module on the motherboard of the circuit module designed for each type of mobile communication terminal.

For example, there is a case in which two of the duplexers 500, provided in the circuit module, are mounted on the mounting substrate of a circuit module in such a manner that the common terminals 504 neighbor each other in accordance with the arrangement of mounting electrodes connected to the common terminals 504 of the duplexers 500. In this case, since the duplexers 500 are arranged in such a manner as to be point-symmetrical about a rotation point that is the middle point between the common terminals 504, the transmission terminals 502 and the reception terminals 503 of the duplexers 500 are arranged in such a manner as to be point-symmetrical about the rotation point, which is the middle point, i.e., in such a manner as to be arranged spaced apart from each other on the opposite sides of the middle point. As a result, there is a problem in that complex wiring patterns are needed for electrical connection of the duplexers 500 to be provided on the mounting substrate of the circuit module.

Hence, in the example described above, in order to simplify the wiring patterns provided on the mounting substrate of the circuit module on which the duplexers 500 are mounted, it is required, when the two duplexers 500 are mounted on the mounting substrate of the circuit module in such a manner that the common terminals 504 neighbor each other, to arrange the transmission terminals 502 and the reception terminals 503 of the duplexers 500 in such a manner as to be line-symmetrical about a straight line that is parallel with the long sides of the back surfaces 501 of the duplexers 500 and that passes through the middle point, i.e., in such a manner that the transmission terminals 502 of the duplexers 500 are arranged on the same side and the reception terminals 503 of the duplexers 500 are arranged on the same side.

For this purpose, it is necessary to prepare duplexers 500 having different arrangements in which the positions of the transmission terminal 502 and the reception terminal 503 provided on the back surface 501 are exchanged, and to mount the duplexers 500 having different arrangements of the transmission terminal 502 and the reception terminal 503 on the mounting substrate of a circuit module in such a manner that the common terminals 504 neighbor each other. Preparing the duplexers 500 having different terminal arrangements in this manner has caused an increase in the manufacturing cost of the circuit module.

SUMMARY OF THE INVENTION

In view of the above described problems, preferred embodiments of the present invention provide a duplexer with a high degree of freedom of design when a circuit module is mounted on a mounting substrate of a circuit module and provide a circuit module including such a duplexer.

A duplexer according to a preferred embodiment of the present invention includes a first filter and a second filter with different frequency bands, wherein a back surface of a main body of the duplexer includes thereon a common terminal connected to one of an input side and an output side of the first filter and to one of an input side and an output side of the second filter; a first terminal connected to another side of the first filter that is not connected to the common terminal; and a second terminal connected to another side of the second filter that is not connected to the common terminal. The common terminal is arranged in a central region of the back surface, and the first terminal and the second terminal are arranged on a virtual line that passes through the common terminal and that is parallel or substantially parallel with one side of the back surface of the main body such that the common terminal is sandwiched between the first terminal and the second terminal.

A duplexer according to another preferred embodiment of the present invention includes a first filter and a second filter with different frequency bands, wherein a back surface of a main body of the duplexer includes thereon a common terminal connected to one of an input side and an output side of the first filter and to one of an input side and an output side of the second filter; a first terminal connected to another side that is not connected to the common terminal; and two second terminals connected to another side of the second filter that is not connected to the common terminal. The common terminal is arranged in a central region of the back surface, and the first terminal is arranged on a virtual line that passes through the common terminal and that is parallel or substantially parallel with one side of the back surface of the main body and the second terminals are line-symmetrical about the virtual line with the common terminal being sandwiched between the second terminals.

A duplexer according to a further preferred embodiment of the present invention includes a first filter and a second filter with different frequency bands, wherein a back surface of a main body of the duplexer includes thereon a common terminal connected to one of an input side and an output side of the first filter and to one of an input side and an output side of the second filter; two first terminals connected to another side of the first filter that is not connected to the common terminal; and two second terminals connected to another side of the second filter that is not connected to the common terminal. The first terminals are line-symmetrical about a virtual line that passes through the common terminal and that is parallel or substantially parallel with one side of the back surface of the main body and the common terminal is sandwiched between the first terminals, and the second terminals are line-symmetrical about the virtual line and the common terminal is sandwiched between the second terminals.

Further, a plurality of ground terminals may be provided on the back surface, and the ground terminals may be arranged between the common terminal and the first terminal and between the common terminal and the second terminal. With this structure, a signal input or output through the common terminal is prevented from interfering with a signal input through the first terminal and a signal output through the second terminal, such that isolation characteristics among the terminals are enhanced.

Further, a plurality of ground terminals may be provided on the back surface, and the ground terminals may be arranged on a straight line parallel or substantially parallel with the virtual line. With this structure, various components arranged near the duplexer on a side thereof where the ground terminals are arranged are prevented from being electromagnetically coupled to the duplexer and, hence, isolation characteristics between the duplexer and the various components are enhanced.

Further, the ground terminals are preferably arranged on straight lines that are parallel or substantially parallel with the virtual line and that are located on two sides of the virtual line. With this structure, various components arranged near the duplexer on both sides thereof are prevented from being electromagnetically coupled to the duplexer and, hence, isolation characteristics between the duplexer and the various components are further enhanced.

Further, the ground terminals may have a larger area than the common terminal, the first terminal, and the second terminal. With this structure, isolation characteristics among the common terminal, the first terminal, and the second terminal are further enhanced.

Further, preferably, a first filter element defining the first filter and a second filter element defining the second filter are rectangular or substantially rectangular, and one terminal connected to the common terminal is provided on a first end side and another terminal is provided on a second end side in a longitudinal direction in each of the first and second filter elements, and the first filter element and the second filter element are arranged in the main body such that, regarding the first filter element, the one terminal is arranged on a common terminal side and the other terminal is arranged on a first terminal side, and, regarding the second filter element, the one terminal is arranged on the common terminal side and the other terminal is arranged on a second terminal side. With this structure, the common terminal, the first terminal, and the second terminal are spaced apart from one another such that isolation characteristics between the first terminal and the second terminal are enhanced.

Further, preferably, the first filter and the second filter are arranged such that a first filter element and a second filter element are arranged next to each other on a substrate in a longitudinal direction of the substrate, one terminal that is common to the first filter element and the second filter element and that is connected to the common terminal is provided in a central region of the substrate in the longitudinal direction, and other terminals of the first filter element and the second filter element are provided on two end sides of the substrate in the longitudinal direction, and the substrate is arranged in the main body such that the one terminal is arranged on a common terminal side and the other terminals are respectively arranged on a first terminal side and a second terminal side. With this structure, the common terminal, the first terminal, and the second terminal are spaced apart from one another such that isolation characteristics between the first terminal and the second terminal are further enhanced.

Further, a circuit module according to a preferred embodiment of the present invention preferably includes a duplexer according to any of the preferred embodiments of the present invention described above; and a mounting substrate that mounts the duplexer, wherein a common electrode connected to the common terminal, a first electrode connected to the first terminal, a second electrode connected to the second terminal, and a ground electrode are provided on the mounting substrate. The ground electrode is planar or substantially planar and extends over a whole surface excluding a portion where the common terminal is provided in plan view. With this structure, isolation characteristics among the terminals are enhanced.

According to various preferred embodiments of the present invention, merely by arranging a plurality of duplexers adjacent to each other such that the first terminals are aligned and the second terminals are aligned, the common terminals, the first terminals, and the second terminals provided on the respective duplexers are not spaced apart from one another. Accordingly, there is no need to prepare a plurality of the duplexers having different terminal arrangements, and the freedom of design at the time when the duplexers are mounted on the mounting substrate of the circuit module is significantly increased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
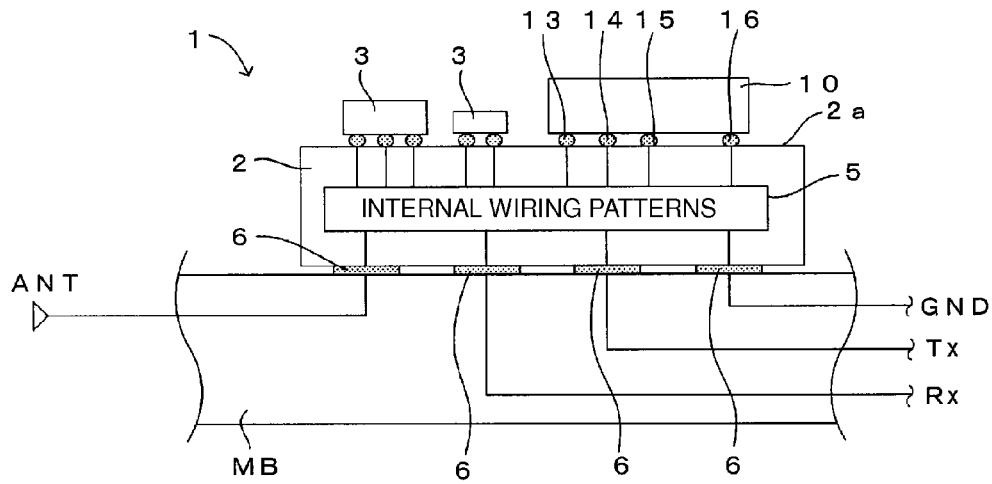
FIG. 1 is a diagram illustrating a preferred embodiment of a circuit module according to the present invention.
Figure 2:
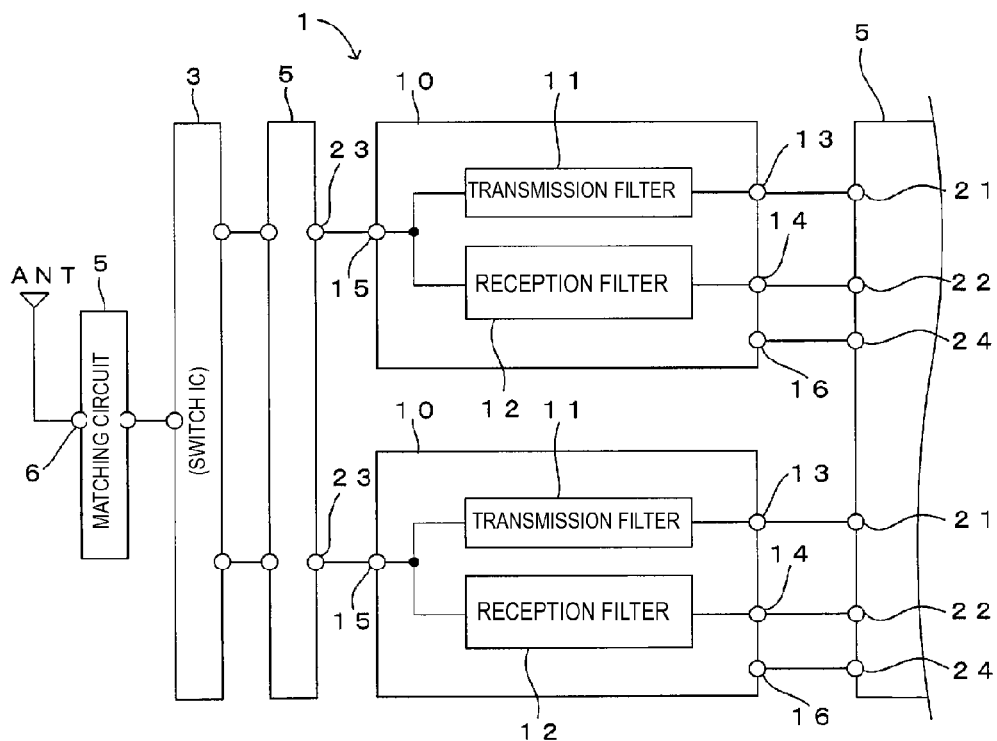
FIG. 2 is a block diagram illustrating the internal configuration of the circuit module illustrated in FIG. 1.
Figure 3:
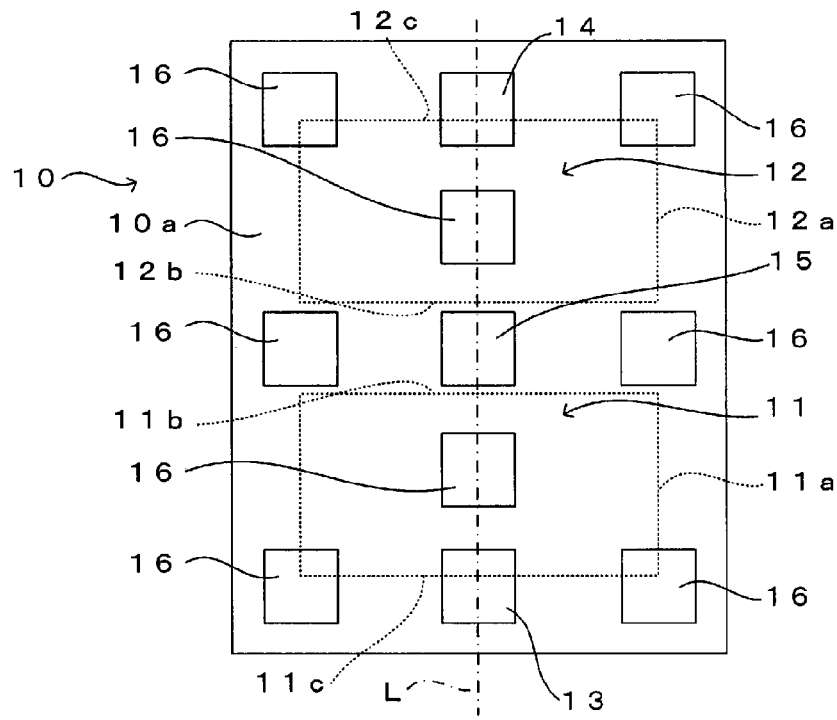
FIG. 3 is a bottom view illustrating an example of the terminal arrangement of a duplexer.
Figure 4:
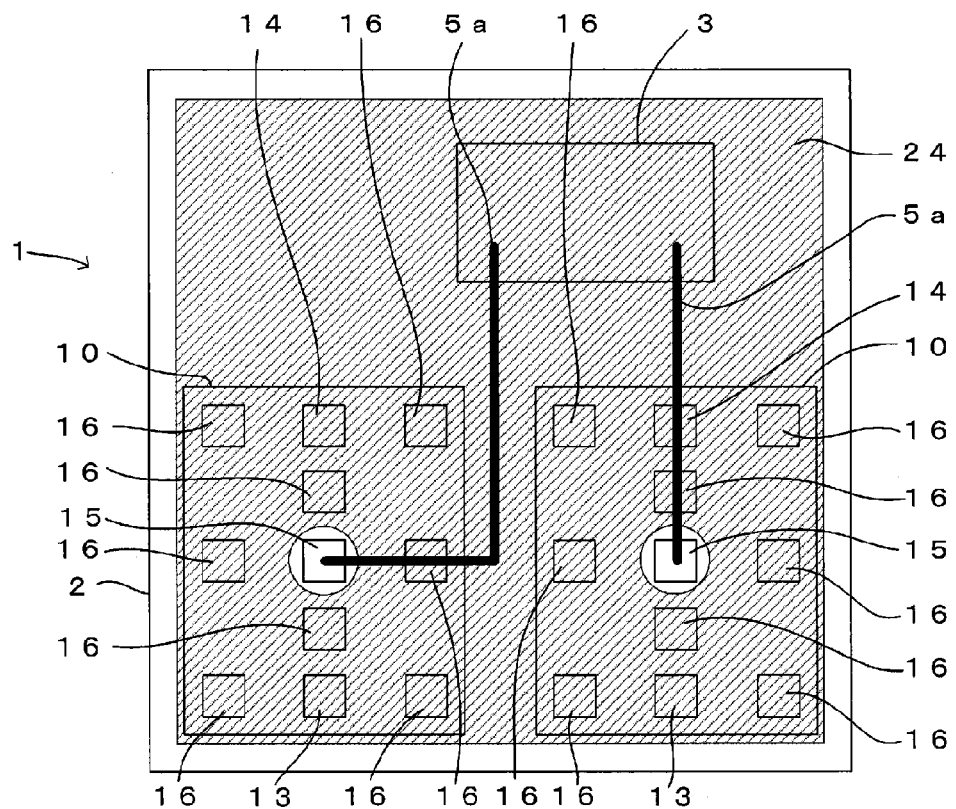
FIG. 4 is a bottom view illustrating an example of the electrode shape of a ground electrode of a mounting substrate.

A preferred embodiment of a circuit module including a duplexer according to the present invention will be described with reference to FIG. 1 to FIG. 4. FIG. 1 is a diagram illustrating the present preferred embodiment of a circuit module according to the present invention. FIG. 2 is a block diagram illustrating the internal configuration of the circuit module illustrated in FIG. 1. FIG. 3 is a bottom view illustrating an example of the terminal arrangement of the duplexer. FIG. 4 is a bottom view illustrating an example of the electrode shape of a ground electrode of a mounting substrate.

A circuit module 1 illustrated in FIG. 1 is mounted on a motherboard MB included in a mobile communication terminal, such as a cellular phone and a mobile information terminal. In the present preferred embodiment, the circuit module 1 includes a mounting substrate 2, a plurality of duplexers 10 provided individually for communication operations based on different communication standards, such as the GSM standard and the CDMA standard, and various components 3, such as a switch IC, filters, resistors, capacitors, and coils, for example. The circuit module 1 preferably is a high-frequency antenna switch module, for example. The duplexers 10 and the components 3, which are mounted on electrodes provided on a mounting surface 2a of the mounting substrate 2, are electrically connected to a plurality of mounting electrodes 6 located on the back surface of the mounting substrate 2 through internal wiring patterns 5. By mounting the circuit module 1 on the motherboard MB, various signal lines, such as an antenna line ANT, a ground line GND, transmission signal lines Tx, and reception signal lines Rx, and power lines are connected to the circuit module 1, such that input/output of transmission/reception signals are performed between the motherboard MB and the circuit module 1.

Note that the circuit module 1 supports communication based on a plurality of communication standards. The switch IC is switched on the basis of a switching signal from the motherboard MB included in a mobile communication terminal, such that the antenna line ANT is selectively connected to a duplexer 10 corresponding to the communication standard selected at the mobile communication terminal, among the plurality of duplexers 10.

In the present preferred embodiment, the mounting substrate 2 preferably is a ceramic multilayer body formed as a result of a plurality of dielectric layers defined by ceramic green sheets being stacked, sintered, and integrated. Via conductors and electrode patterns are appropriately provided on the dielectric layers, such that the internal wiring patterns 5 are provided.

That is, ceramic green sheets defining the dielectric layers are preferably formed such that a slurry made of a mixture of, for example, alumina and glass powder mixed together with a solvent, an organic binder, and the like is formed into sheets using a film growth apparatus, at a temperature of lower than about 1000° C. so as to allow low-temperature sintering. Then, via holes are formed using a laser process in the ceramic green sheets that have been cut out in a predetermined shape. Via conductors for interlayer connection are formed by filling the formed via holes with conductor paste including, for example, Ag or Cu or by subjecting the via holes to via-fill plating. Various electrode patterns are formed by printing using conductor paste. Preferably in this manner, the dielectric layers are formed.

Note that the internal wiring patterns 5 are formed as a result of electrode patterns and via hole conductors to electrically connect the plurality of duplexers 10 and the various components 3 mounted on the circuit module 1 to the mounting electrodes 6 being provided in the dielectric layers. At this time, circuit components such as capacitors and coils may be formed using the electrode patterns forming the internal wiring patterns 5 and via conductors, or filter circuits and matching circuits may be formed using the circuit components such as the capacitors and coils formed by the electrode patterns and via conductors, for example.

The duplexer 10 is used to separate a transmission signal and a reception signal with different frequencies. Referring to FIG. 2 and FIG. 3, the duplexer 10 includes a transmission filter 11 (corresponding to a "first filter") and a reception filter 12 (corresponding to the "second filter") with different pass bands for high-frequency signals. The transmission filter 11 and the reception filter 12 respectively include a transmission filter element 11a (first filter element) and a reception filter element 12a (second filter element) respectively including SAW (surface acoustic wave) filter elements.

Note that each of the filter elements includes a piezoelectric substrate such as a crystal substrate and a $LiTaO_3$ substrate. Terminal electrodes provided on the piezoelectric substrate are connected to the mounting electrodes on the main surface of a package substrate such as an alumina substrate through bumps and the like.

The duplexer 10 includes a common terminal 15 (antenna terminal) connected to the output side of a transmission filter 11 and the input side of a reception filter 12, a transmission terminal 13 (corresponding to a "first terminal"), for input to the transmission filter 11, connected to the other side of the transmission filter 11 not connected to the common terminal 15, a reception terminal 14 (corresponding to a "second terminal"), for output from the reception filter 12, connected to the other side of the reception filter 12 not connected to the common terminal 15, and a plurality of ground terminals 16. The respective terminals are connected to a common electrode 23, a transmission electrode 21 (corresponding to a "first electrode"), a reception electrode 22 (corresponding to a "second electrode"), and a ground electrode 24 provided on the mounting substrate 2 for each of the duplexers 10.

Specifically, in the present preferred embodiment, the transmission terminal 13, the reception terminal 14, the common terminal 15, and the ground terminals 16 preferably are respectively defined by rectangular or substantially rectangular lands on a back surface 10a of the rectangular or substantially rectangular main body of the duplexer 10 in plan view, for example. The common terminal 15 is arranged in a central region of the back surface 10a, and the transmission terminal 13 and the reception terminal 14 are arranged, with the common terminal 15 therebetween, on a virtual line L which passes through the common terminal 15 and is parallel or substantially parallel with one side of the back surface 10a of the main body of the duplexer 10.

The plurality of ground terminals 16 are provided on the back surface 10a of the duplexer 10, and the ground terminals 16 are arranged between the common terminal 15 and the transmission terminal 13 and between the common terminal 15 and the reception terminal 14 and are arranged in rows along the straight lines which are parallel or substantially parallel with the virtual line L and are respectively located on the two sides of the virtual line L.

Preferably, each of the transmission filter element 11a and the reception filter element 12a is rectangular or substantially rectangular, one terminal (not illustrated) of the transmission filter element 11a and one terminal of the reception filter element 12 connected to the common terminal 15 are respectively arranged on a first end 11b side and a first end 12b side in the longitudinal direction, and the other terminals (not illustrated) are respectively arranged on a second end 11c side and a second end 12c side. The transmission filter element 11a and the reception filter element 12a are arranged in the main body of the duplexer 10 in such a manner that the one terminal of the transmission filter element 11a and the one terminal of the reception filter element 12a connected to the common terminal 15 are both arranged on the common terminal 15 side, and the other terminals are respectively arranged on the transmission terminal 13 side and the reception terminal 14 side.

Note that, in the present preferred embodiment, the transmission filter 11 and the reception filter 12 included in the duplexer 10 preferably include the transmission filter element 11a and the reception filter element 12a, which are SAW filter elements. However, other than SAW filter elements, the transmission filter element 11a and the reception filter element 12a may be provided by connecting a plurality of resonators and coils, and the transmission filter 11 and the reception filter 12 may be provided by any other configuration or method if a transmission signal and a reception signal having different frequencies are reliably separated. In other words, the transmission filter 11 and the reception filter 12 may be provided using the transmission filter element 11a and the reception filter element 12a in general use, and since the configurations and operations of these filters are well known, the detailed descriptions of the configurations and operations of the transmission filter element 11a and the reception filter element 12a are omitted.

In the present preferred embodiment, transmission electrodes 21, reception electrodes 22, and common electrodes 23 preferably are respectively provided by rectangular or substantially rectangular lands on the mounting surface 2a, which is the uppermost layer of a plurality of dielectric layers defining the mounting substrate 2. The ground electrode 24 is provided on the front surface of a second dielectric layer from the top dielectric layer on which the mounting surface 2a is provided. The ground electrode 24 is arranged between the transmission electrodes 21 and the reception electrodes 22 in plan view.

In the present preferred embodiment, the transmission electrodes 21 and the reception electrodes 22 are provided near the outer edge of the mounting surface 2a of the mounting substrate 2. The ground electrode 24 preferably is T-shaped or substantially T-shaped in plan view such that the end portion on the outer edge side extends on both sides along the outer edge, thus being arranged also between the outer edge and the transmission electrodes 21 and between the outer edge and the reception electrodes 22. Further, the ground electrode 24 preferably surrounds the three sides of each of the transmission electrode 21, the reception electrode 22, and the common electrode 23 in plan view. In other words, in the present preferred embodiment, the ground electrode 24 preferably has a shape in which each of three sides of a rectangle includes rectangular or substantially rectangular cut-out portions and the transmission electrode 21, the reception electrode 22, and the common electrode 23 are respectively arranged in the three cut-out portions in plan view.

The ground electrode 24 is connected to the mounting electrode 6 connected to the ground line GND of the motherboard MB as a result of a plurality of via conductors of the internal wiring patterns 5 are connected to the ground electrode 24. In the present preferred embodiment, in particular, in plan view, a plurality of via conductors are connected to the ground electrode 24 along the edge portion of the ground electrode 24 near the transmission electrodes 21. Further, in the present preferred embodiment, in plan view, a plurality of via conductors are connected to the ground electrode 24 along the edge of the ground electrode 24, from an edge portion of the ground electrode 24 near the transmission electrode 21 to an edge portion of the ground electrode 24 near the reception electrode 22. Note that the ground terminals 16 of the duplexer 10 are connected to the ground electrode 24 through the mounting electrodes provided on the mounting surface 2a and via conductors connected to these electrodes.

In the present preferred embodiment, the ground electrode 24 is provided in a plurality over a plurality of dielectric layers of the mounting substrate 2. The ground electrodes 24 are connected to one another through a plurality of via conductors. Further, referring to FIG. 4, in the present preferred embodiment, one of the ground electrodes 24 provided on the plurality of dielectric layers preferably is planar or substantially planar and extends over the whole surface of the corresponding dielectric layer excluding portions where the common electrodes 23 (common terminals 15) are arranged in plan view.

In the present preferred embodiment, as illustrated in FIG. 4, a wiring layer (dielectric layer) on which signal lines 5a, among the internal wiring patterns 5, connected to the common terminals 15 of the duplexers 10 and connected to the antenna line ANT through the component 3 (switch IC) are provided is isolated by the ground electrode 24 from a wiring layer on which signal lines connected to the transmission terminals 13 and the reception terminals 14 and connected to the transmission signal lines Tx and the reception signal lines Rx are provided.

Note that, in FIG. 4, the positions on the mounting substrate 2 at which the duplexers 10 and the component 3 (switch IC) are mounted are represented by solid lines and the signal lines 5a connecting the common terminals 15 of the duplexers 10 to the component 3 are schematically represented by bold lines for ease of description.

A non-limiting example of a method of manufacturing the circuit module 1 illustrated in FIG. 1 will be briefly described.

First, via holes are formed using, for example, a laser in ceramic green sheets formed in a predetermined shape. Then, via conductors for interlayer connection are formed by filling the formed via holes with conductor paste or by subjecting the via holes to via-fill plating. Next, the electrode patterns, such as the transmission electrodes 21, the reception electrodes 22, the common electrodes 23, and the ground electrodes 24 are formed by printing using conductor paste, such that ceramic green sheets to form dielectric layers that form the mounting substrate 2 are prepared. Note that a plurality of electrode patterns, such as via conductors, the transmission electrodes 21, the reception electrodes 22, the common electrode 23, and the ground electrode 24 are provided to make it possible to produce a large number of the mounting substrates 2 at the same time.

Then, the dielectric layers are stacked to define a multilayer body is formed. After sintering, grooves to divide the multilayer body into the individual mounting substrates 2 are formed to surround the regions of the mounting substrates 2. Next, the multilayer body is sintered at a low temperature while being pressed, such that an aggregate of the mounting substrates 2 is formed.

Next, before division into individual mounting substrates 2, the duplexers 10 and the components 3 are mounted on the mounting surfaces 2a of the aggregate of mounting substrates 2, and the mounting surfaces 2a are covered with a mold resin. Subsequent to heat hardening of the resin, a mold layer (not illustrated) is provided on each of the mounting substrates 2, such that an aggregate of the circuit modules 1 is formed. Then the aggregate of the circuit modules 1 is divided into individual units such that the circuit modules 1 are completed.

In the circuit module 1 formed in this manner, a transmission signal output from the transmission signal line Tx of the motherboard MB to the transmission terminal 13 of the duplexer 10 through the mounting electrode 6 and the internal wiring pattern 5 is input to the transmission filter 11, subjected to predetermined filter processing, output from the common terminal 15 to the mounting substrate 2 side, and output to the antenna line ANT of the motherboard MB through the switch IC (component 3), the internal wiring pattern 5 (matching circuit), and the mounting electrode 6. An input signal input from the antenna line ANT of the motherboard MB to the common terminal 15 of the duplexer 10 through the mounting electrode 6, the internal wiring pattern 5 (matching circuit), and the switch IC is input to the reception filter 12, subjected to predetermined filter processing, output to the mounting substrate 2 side from the reception terminal 14, and output to the reception signal line Rx of the motherboard MB through the internal wiring pattern 5 and the mounting electrode 6.

Note that the circuit module 1 including the mounting substrate 2 in which the internal wiring patterns 5 are provided, the duplexers 10, the components 3, and the mold layer may be formed using a known general manufacturing method, not limited to the above-described manufacturing method. The mounting substrate 2 may be a printed circuit board, an LTCC substrate, an alumina substrate, a glass substrate, a composite material substrate, a single-layer substrate, a multilayer substrate, using a resin, a ceramic, a polymer material, or the like. The mounting substrate 2 may be formed by appropriately selecting an optimum material in accordance with an objective, application or purpose for which the circuit module 1 is used. Further, the circuit module 1 may be formed by providing a cavity in the mounting substrate 2, mounting the duplexer 10 and the components 3 in the cavity, and then sealing the cavity with a cap.

Although the matching circuit is preferably defined by the internal wiring patterns 5 in the present preferred embodiment, the matching circuit may be defined by the component 3, such as a chip coil, mounted on the mounting surface 2a of the mounting substrate 2.

As described above, in the present preferred embodiment, the common terminal 15 connected to the output side and input side of the respective transmission filter 11 and the reception filter 12 with different pass bands, and the transmission terminal 13 connected to the other side, not connected to the common terminal 15, of the transmission filter 11 and the reception terminal 14 connected to the other side, not connected to the common terminal 15, of the reception filter 12 are provided on the back surface 10a of the main body having a rectangular or substantially rectangular shape in plan view. The common terminal 15 is arranged in the central region of the back surface 10a of the main body of the duplexer 10, and the transmission terminal 13 and the reception terminal 14 are arranged, with the common terminal 15 therebetween, on a virtual line L which passes through the common terminal 15 and is parallel or substantially parallel with one side of the back surface 10a of the main body of the duplexer 10.

Hence, merely by arranging a plurality of the duplexers 10 adjacent to each other such that the transmission terminals 13 are aligned and the reception terminals 14 are aligned, the common terminals 15, the transmission terminals 13, and the reception terminals 14 provided on the respective duplexers 10 are not spaced apart from one another. Accordingly, there is no need to prepare a plurality of the duplexers 10 having different terminal arrangements, and the freedom of design at the time when the duplexers 10 are mounted on the mounting substrate 2 of the circuit module 1 is significantly increased.

Since a plurality of the ground terminals 16 are provided on the back surface 10a of the duplexer 10, and the ground terminals 16 are respectively arranged between the common terminal 15 and the transmission terminal 13 and between the common terminal 15 and the reception terminal 14, a signal input or output through the common terminal 15 is prevented from interfering with a signal input through the transmission terminal 13 and a signal output through the reception terminal 14, such that isolation characteristics among the terminals 13 to 15 are enhanced.

Further, since the ground terminals 16 are provided on both sides of the virtual line L and are arranged in rows along straight lines parallel or substantially parallel with the virtual line L, the various components 3 arranged on the two sides of the duplexer 10 and near the duplexer 10 are prevented from being electromagnetically coupled to the duplexer 10. Hence, isolation characteristics between the duplexer 10 and the various components 3 are enhanced.

In addition, when the duplexer 10 is mounted on the mounting substrate 2, the strength with which the duplexer 10 is mounted on the mounting substrate 2 is increased since the number of terminals of the back surface 10a of the duplexer 10 connected, for example, through soldering to the various electrodes 21 to 23 on the mounting substrate 2 is increased.

Note that the ground terminals 16 may be arranged along a straight line parallel or substantially parallel with the virtual line L only on one side of the virtual line L. In this case, electromagnetic coupling is prevented from being generated between the duplexer 10 and the various components 3 arranged near the duplexer 10 on a side of the duplexer 10 on which the ground terminals 16 of the duplexer 10 are arranged in a straight line.

The transmission filter element 11a of the transmission filter 11 and the reception filter element 12a of the reception filter 12 preferably are rectangular or substantially rectangular, and one terminal of the transmission filter element 11a and one terminal of the reception filter element 12a connected to the common terminal 15 are respectively arranged on the first end side 11b and the first end 12b side in the longitudinal direction and the other terminals are arranged on the second end 11c side and on the second end 12c side. The transmission filter element 11a and the reception filter element 12a are arranged in the main body of the duplexer 10 such that one terminal of the transmission filter element 11a and one terminal of the reception filter element 12a connected to the common terminal 15 are provided on the common terminal 15 side, and the other terminals are respectively arranged on the transmission terminal 13 side and the reception terminal 14 side. Hence, the common terminal 15, the transmission terminal 13, and the reception terminal 14 are spaced apart from one another, such that isolation characteristics between the transmission terminal 13 and the reception terminal 14 are enhanced.

The ground electrodes 24 are provided over a plurality of dielectric layers of the mounting substrate 2 of the circuit module 1. One of the ground electrodes 24 provided on the plurality of dielectric layers preferably is planar or substantially planar and extends over the whole surface of the corresponding dielectric layer excluding portions where the common electrodes 23 (common terminals 15) are arranged in plan view. By isolating a dielectric layer (wiring layer) on which signal lines 5a connected to the common terminals 15 are provided from a wiring layer on which signal lines connected to the transmission terminals 13 and the reception terminals 14 are provided using the ground electrode 24, isolation characteristics between the common terminals 15 and the transmission terminals 13 and between the common terminals 15 and the reception terminals 14 are enhanced.

Note that the ground electrode 24 may be planar or substantially planar so as to exclude positions where the transmission terminals 13 and the reception terminals 14, in addition to the common terminals 15, are provided.

Since a plurality of via conductors are connected to the ground electrode 24 of the mounting substrate 2 along an edge of the ground electrode 24 near the transmission electrodes 21 in plan view, even when a transmission signal output from the transmission electrode 21 of the mounting substrate 2 to the transmission terminal 13 of the duplexer 10 leaks to the ground electrode 24, the transmission signal which leaks to the ground electrode 24 flows into via conductors that are connected to the ground line GND of the motherboard MB and that are connected to the edge portion of the ground electrode 24 near the transmission electrode 21. Hence, the transmission signal output from the transmission electrode 21 and leaking to the ground electrode 24 is prevented from leaking to the reception electrode 22 side through a path along the edge portion of the ground electrode 24, such that the transmission electrode 21 and the reception electrode 22 are prevented from being electrically coupled to each other through the transmission signal that leaks through the ground electrode 24. As a result, isolation characteristics between the transmission electrode 21 and the reception electrode 22 provided on the mounting substrate 2 where the duplexer 10 is mounted are enhanced.

Since a plurality of via conductors are connected to the ground electrode 24 along the edge of the ground electrode 24, from an edge portion of the ground electrode 24 near the transmission electrodes 21 to edge portions of the ground electrode 24 near the reception electrodes 22 in plan view, a transmission signal output from the transmission electrode 21 and leaking to the ground electrode 24 efficiently flows into the plurality of via conductors connected to the ground electrode 24 along the edge portion of the ground electrode 24. Hence, the transmission signal leaking to the ground electrode 24 is efficiently prevented from leaking to the reception electrode 22 side through a path along the edge portion of the ground electrode 24. As a result, isolation characteristics between the transmission electrode 21 and the reception electrode 22 provided on the mounting substrate 2 where the duplexer 10 is mounted are further enhanced.

Further, since each of the transmission electrode 21, the reception electrode 22, and the common electrode 23 is preferably provided on the mounting surface 2a of the mounting substrate 2 by rectangular or substantially rectangular lands, and the ground electrode 24 is arranged to surround at least three sides of each of the transmission electrode 21, the reception electrode 22, and the common electrode 23 in plan view, a transmission signal output from the transmission electrode 21 and leaking to the ground electrode 24 efficiently flows into via conductors connected to the ground electrode 24 along the edge portion of the ground electrode 24 surrounding the at least three sides of the transmission electrode 21. In addition, in plan view, the distance along the edge portion of the ground electrode 24 between the edge portion of the ground electrode 24 near the transmission electrode 21 and the edge portion of the ground electrode 24 near the reception electrode 22 becomes long. As a result, a transmission signal leaking to the ground electrode 24 is reliably prevented from leaking to the reception electrode 22 through a path along the edge portion of the ground electrode 24.

Figure 5:
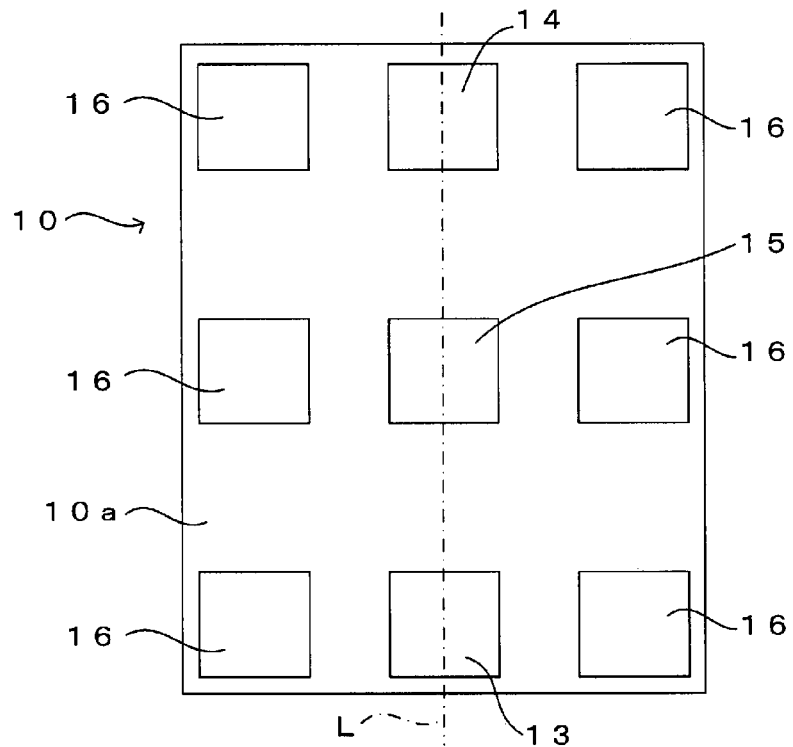
FIG. 5 is a diagram illustrating another example of the terminal arrangement of a duplexer.

Referring to FIG. 5, another example (1) of the terminal arrangement of a duplexer will be described. FIG. 5 is a diagram illustrating the other example of the terminal arrangement of a duplexer. Unlike the preferred embodiment described above, in the other example (1) of a terminal arrangement, the ground terminal 16 is not arranged between the common terminal 15 and the transmission terminal 13 and between the common terminal 15 and the reception terminal 14, as illustrated in FIG. 5. The rest of the configuration preferably is similar to that of the preferred embodiment described above and, hence, the description of the configuration is omitted, by using the same reference symbols.

Figure 6:
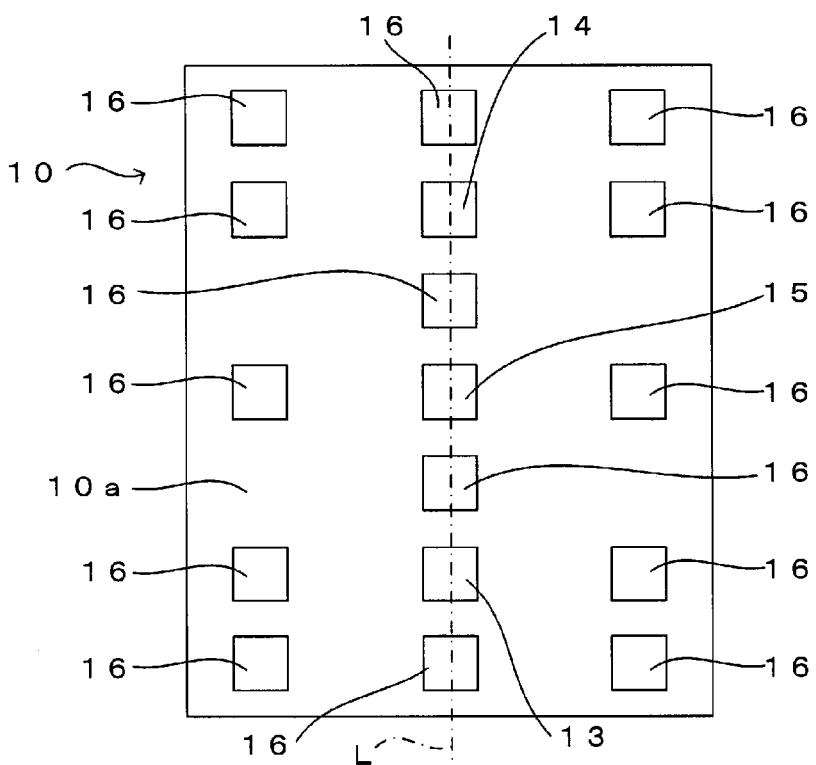
FIG. 6 is a diagram illustrating another example of the terminal arrangement of a duplexer.

Referring to FIG. 6, another example (2) of the terminal arrangement of a duplexer will be described. FIG. 6 is a diagram illustrating the other example of the terminal arrangement of a duplexer. Unlike the preferred embodiment described above, in the other example (2) of a terminal arrangement, the ground terminals 16 are further arranged along the short sides of the back surface 10a of the duplexer 10 on the outer sides of the transmission terminal 13 and the reception terminal 14, as illustrated in FIG. 6. The rest of the configuration preferably is similar to that of the preferred embodiment described above and, hence, the description of the configuration is omitted, by using the same reference symbols.

With this configuration, isolation characteristics between the duplexer 10 and the components 3 arranged around the duplexer 10 are further enhanced.

Figure 7:
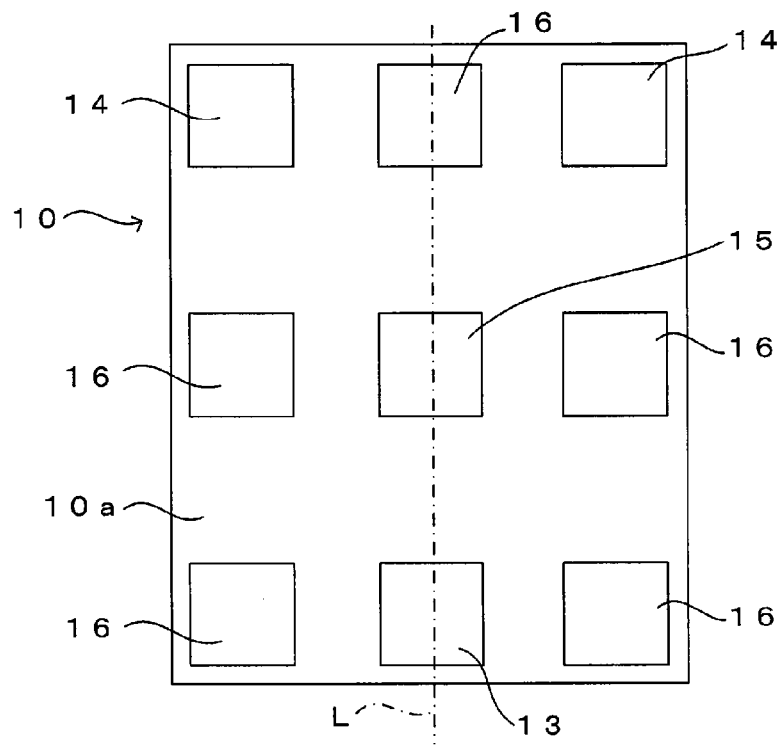
FIG. 7 is a diagram illustrating another example of the terminal arrangement of a duplexer.

Referring to FIG. 7, another example (3) of the terminal arrangement of a duplexer will be described. FIG. 7 is a diagram illustrating the other example of the terminal arrangement of a duplexer. Unlike the preferred embodiment described above, in the other example (3) of a terminal arrangement, the reception filter 12 includes an unbalanced/balanced-type reception filter element 12a, and as illustrated in FIG. 7, two balanced reception terminals 14 connected to an end of the reception filter 12 not connected to the common terminal 15 are provided on the back surface 10a of the duplexer 10. The rest of the configuration preferably is similar to that of the preferred embodiment described above and, hence, the description of the configuration is omitted, by using the same reference symbols.

Referring to FIG. 7, on the back surface 10a of the main body of the duplexer 10, the transmission terminal 13, the two reception terminals 14, the common terminal 15, and the ground terminals 16 are each provided by rectangular or substantially rectangular lands. The common terminal 15 is arranged in the central portion of the back surface 10a, the transmission terminal 13 is arranged on the virtual line L that passes through the common terminal 15 and is parallel or substantially parallel with a side of the back surface 10a of the main body of the duplexer 10, and the reception terminals 14 are line-symmetrical about the virtual line L with the common terminal 15 therebetween.

Further, a plurality of the ground terminals 16 are provided on the back surface 10a of the duplexer 10, and the ground terminals 16 are arranged between the reception terminals 14 and on both sides of the transmission terminal 13 and the common terminal 15.

With this configuration, effects similar to those of the preferred embodiment described above are obtained.

It is preferable to make the line lengths between the common terminal 15 and the reception terminals 14 be the same in order to keep the balance of the phases and amplitudes of reception signals which are output from the balanced terminals (the reception terminals 14) in accordance with a signal input at the common terminal 15. By arranging the common terminal 15 and the reception terminals 14 as described above, the lengths between the input and outputs of the unbalanced/balanced-type reception filter 12 can be made the same, such that the balance characteristics of the reception filter 12 are enhanced.

Figure 8:
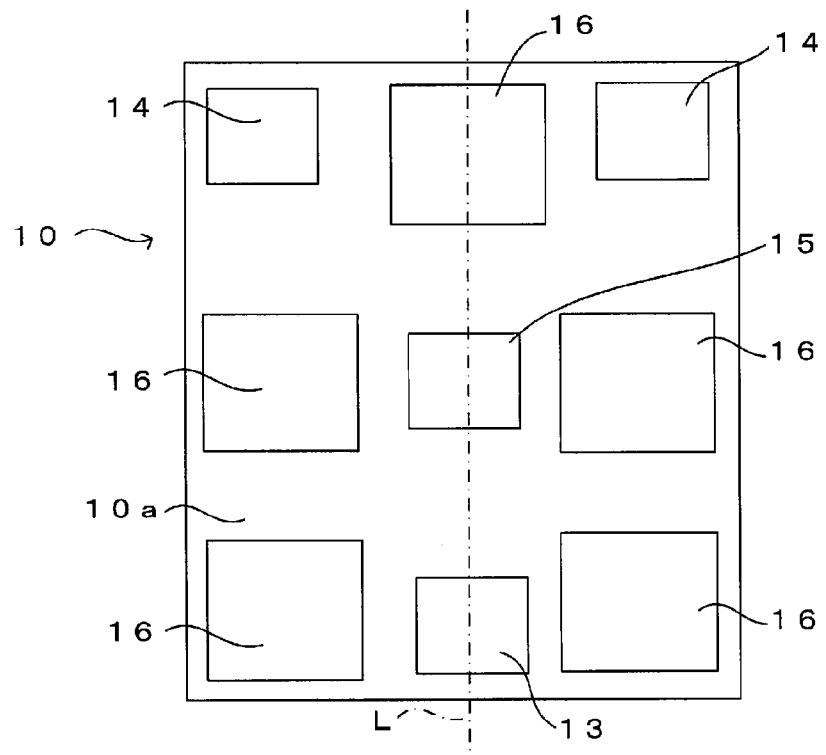
FIG. 8 is a diagram illustrating another example of the terminal arrangement of a duplexer.

Referring to FIG. 8, another example (4) of the terminal arrangement of a duplexer will be described. FIG. 8 is a diagram illustrating the other example of the terminal arrangement of a duplexer. Unlike the preferred embodiment described above, in the other example (4) of a terminal arrangement, the ground terminals 16 preferably have larger areas than the common terminal 15, the reception terminal 14, and the transmission terminal 13. The rest of the configuration preferably is similar to that of the preferred embodiment described above and, hence, the description of the configuration is omitted, by using the same reference symbols.

With this configuration, since the ground terminals 16 preferably have larger areas than the common terminal 15, the reception terminal 14, and the transmission terminal 13, isolation characteristics among the common terminal 15, the transmission terminal 13, and the reception terminal 14 are further enhanced.

Figure 9:
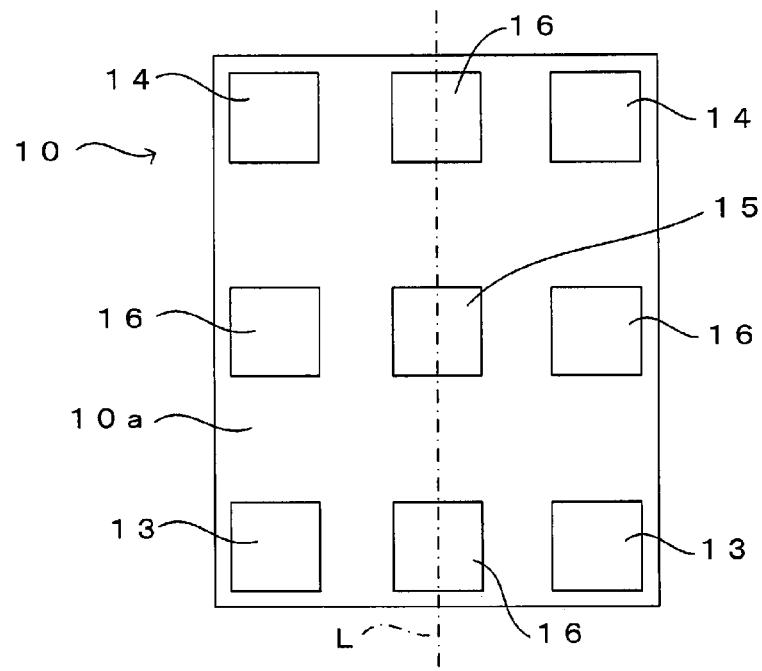
FIG. 9 is a diagram illustrating another example of the terminal arrangement of a duplexer.

Referring to FIG. 9, another example (5) of the terminal arrangement of a duplexer will be described. FIG. 9 is a diagram illustrating the other example of the terminal arrangement of a duplexer. Unlike the preferred embodiment described above, in the other example (5) of a terminal arrangement, the transmission filter 11 and the reception filter 12 respectively include an unbalanced/balanced-type transmission filter element 11a and an unbalanced/balanced-type reception filter element 12a, and as illustrated in FIG. 9, two balanced-side transmission terminals 13 and two balanced-side reception terminals 14 respectively connected to ends, not connected to the common terminal 15, of the transmission filter 11 and the reception filter 12 are provided on the back surface 10a of the duplexer 10. The rest of the configuration preferably is similar to that of the preferred embodiment described above and, hence, the description of the configuration is omitted, by using the same reference symbols.

As illustrated in FIG. 9, on the back surface 10a of the main body of the duplexer 10, the two transmission terminals 13, the two reception terminals 14, the common terminal 15, and the ground terminals 16 preferably are respectively provided by rectangular or substantially rectangular lands. The common terminal 15 is arranged in the central portion of the back surface 10a, the transmission terminals 13 and the reception terminals 14 are respectively line-symmetrical about a virtual line that passes through the common terminal 15 and that is parallel or substantially parallel with a side of the back surface 10a of the duplexer 10, with the common terminal 15 being sandwiched between the transmission terminals 13 and between the reception terminals 14.

In addition, the plurality of ground terminals 16 provided on the back surface 10a of the duplexer 10, are arranged between the transmission terminals 13 and between the reception terminals 14 and on both sides of the common terminal 15.

With this configuration, effects similar to those of the preferred embodiment described above are obtained.

Further, when transmission signals are output from a balanced-output-type power amplifier (PA) or a low-noise amplifier (LNA) to the balanced-side transmission terminals 13, the phases need to be different from each other by 180°, or the power ratio of the transmission signals needs to be 1:1 between the balanced terminals (transmission terminals 13). By arranging the common terminal 15 and the transmission terminals 13 as described above, the lengths between the inputs and output of the unbalanced/balanced-type transmission filter 11 can be made the same, such that the balance characteristics of the transmission filter 11 are enhanced.

It is preferable to make the line lengths between the common terminal 15 and the reception terminals 14 be the same in order to keep the balance of the phases and amplitudes of reception signals which are output from the balanced terminals (the reception terminals 14) in accordance with a signal input at the common terminal 15. By arranging the common terminal 15 and the reception terminals 14 as described above, the lengths between the input and outputs of the unbalanced/balanced-type reception filter 12 can be made the same, such that the balance characteristics of the reception filter 12 are enhanced.

Figure 10:
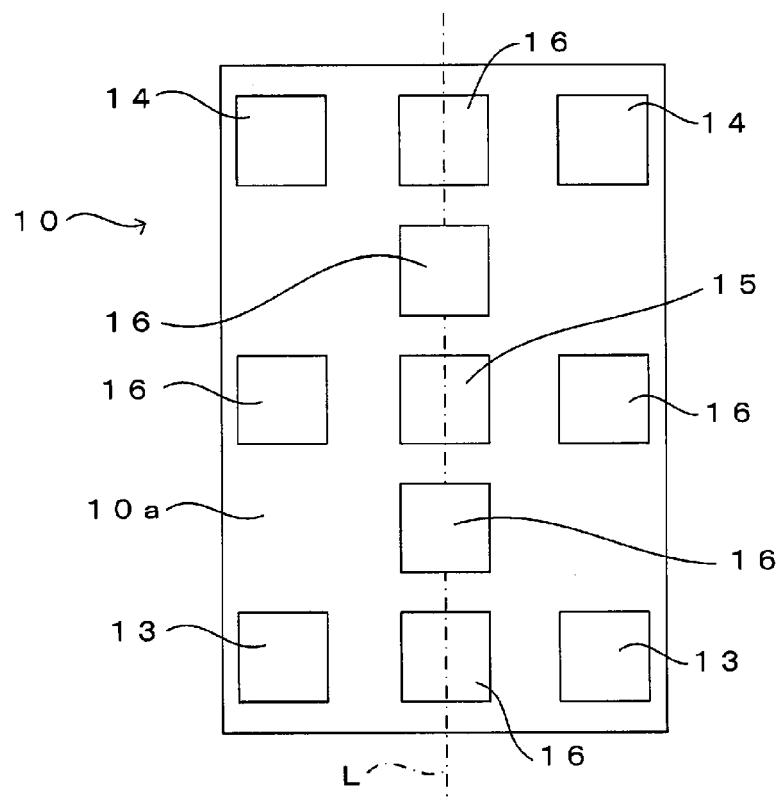
FIG. 10 is a diagram illustrating another example of the terminal arrangement of a duplexer.

Note that, as will be described by another example of the duplexer illustrated in FIG. 10, the ground terminals 16 may be arranged between the reception terminals 14 and the common terminal 15 and between the transmission terminals 13 and the common terminal 15. With this configuration, isolation characteristics among the common terminal 15, the transmission terminals 13, and the reception terminals 14 are further enhanced.

Figure 11:
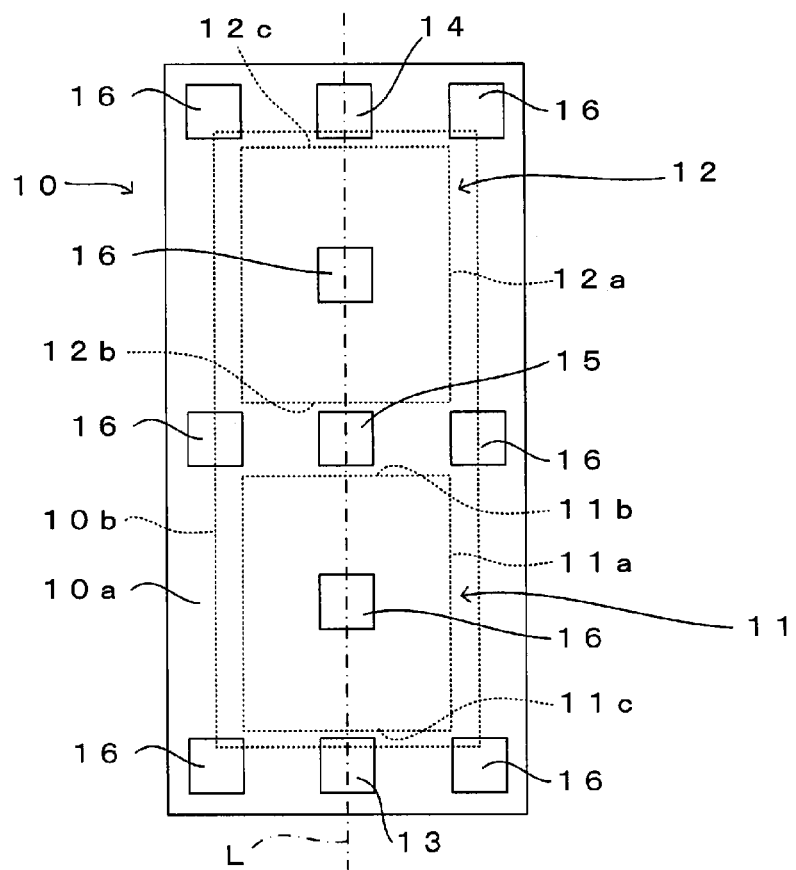
FIG. 11 is a diagram illustrating another example of a duplexer.
Figure 12:
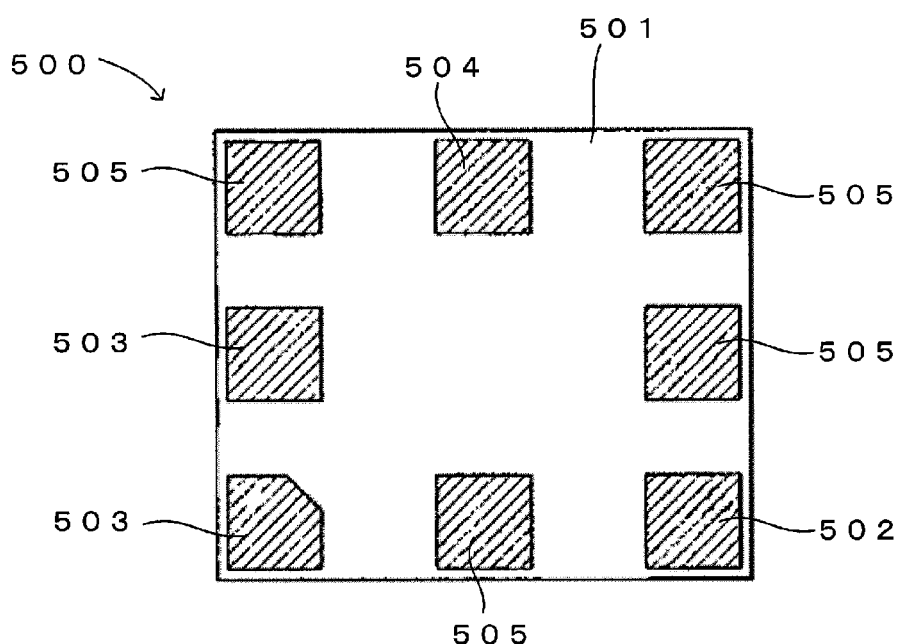
FIG. 12 is a diagram illustrating the terminal arrangement of an existing duplexer.

Next, another example (1) of a duplexer will be described with reference to FIG. 11. FIG. 11 is a diagram illustrating the other example of a duplexer. Unlike the preferred embodiment described above, in the other example (1) of a duplexer, as illustrated in FIG. 11, the transmission filter element 11a and the reception filter element 12a are arranged side by side on a rectangular or substantially rectangular substrate 10b, thus providing the transmission filter 11 and the reception filter 12. The rest of the configuration preferably is similar to that of the preferred embodiment described above and, hence, the description of the configuration is omitted, by using the same reference symbols.

Referring to FIG. 11, the transmission filter 11 and the reception filter 12 are preferably provided such that the transmission filter element 11a and the reception filter element 12a are arranged side by side in the longitudinal direction of the substrate 10b, one terminal (not illustrated) which is common to the transmission filter element 11a and the reception filter element 12a and which is connected to the common terminal 15 is provided in the center of the substrate 10b in the longitudinal direction, on a first end 11b side of the transmission filter element 11a and a first end 12b side of the reception filter element 12a, and the other terminals (not illustrated) of the transmission filter element 11a and the reception filter element 12a are provided on the two end sides of the substrate 10b, on the second end 11c side of the transmission filter element 11a and the second end 12c side of the reception filter element 12a.

The substrate 10b on which the transmission filter 11 and the reception filter 12 are provided is provided in the main body of the duplexer 10 such that the one terminal connected to the common terminal 15 of the transmission filter element 11a and the reception filter element 12a is arranged on the common terminal 15 side and the other terminals of the transmission filter element 11a and the reception filter element 12a are respectively arranged on the transmission terminal 13 side and the reception terminal 14 side.

With this configuration, the common terminal 15, the transmission terminal 13 and the reception terminal 14 are spaced apart from one another, isolation characteristics between the transmission terminal 13 and the reception terminal 14 are enhanced, and operations similar to those of the preferred embodiment described above are obtained.

Note that the present invention is not limited to the preferred embodiments described above, and various modifications other than those described above are possible within the scope of the present invention. For example, although the duplexer 10 preferably includes the transmission filter 11 and the reception filter 12 in the preferred embodiments described above, the duplexer 10 include two of the transmission filters 11 or the duplexer 10 may include two of the reception filters 12. Further, the duplexer 10 may include any combination of the unbalanced/unbalanced-type transmission filter 11 and the reception filter 12 and the unbalanced/balanced-type transmission filter 11 and the reception filter 12.

Further, the shapes of the transmission terminal 13, the reception terminal 14, the common terminal 15, and the ground terminal 16 provided on the back surface 10a of the main body of the duplexer 10, and the shapes of the transmission electrode 21, the reception electrode 22, and the common electrode 23 provided on the mounting surface 2a of the mounting substrate 2 are not limited to rectangular or substantially rectangular shapes, and may be any shapes, such as circular or substantially circular shapes, if the duplexer 10 is mounted on the mounting surface 2a. In addition, the ground electrode 24 need not be provided over a plurality of the dielectric layers of the mounting substrate 2, and may be appropriately provided in shapes other than the examples described above.

Preferred embodiments of the present invention can be broadly applied to duplexers including a first filter and a second filter with different frequency bands.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A duplexer comprising:
   a first filter and a second filter with different frequency bands;
   a main body including a back surface;
   a common terminal mounted on the back surface of the main body and connected to one of an input side and an output side of the first filter and to one of an input side and an output side of the second filter;
   a first terminal mounted on the back surface of the main body and connected to another side of the first filter that is not connected to the common terminal; and
   a second terminal mounted on the back surface of the main body and connected to another side of the second filter that is not connected to the common terminal; wherein
   the common terminal is arranged in a central portion of the back surface;
   the first terminal and the second terminal are arranged on a virtual line that passes through the common terminal and that is parallel or substantially parallel with one side of the back surface of the main body such that the common terminal is sandwiched between the first terminal and the second terminal;
   a plurality of ground terminals are provided on the back surface; and
   the ground terminals are arranged between the common terminal and the first terminal and between the common terminal and the second terminal.

2. The duplexer according to claim 1, wherein the ground terminals are arranged on a straight line parallel or substantially parallel with the virtual line.

3. The duplexer according to claim 1, wherein the ground terminals are arranged on straight lines that are parallel or substantially parallel with the virtual line and that are located on two sides of the virtual line.

4. The duplexer according to claim 1, wherein the ground terminals have a larger area than the common terminal, the first terminal, and the second terminal.

5. The duplexer according to claim 1, wherein
   a first filter element of the first filter and a second filter element of the second filter are rectangular or substantially rectangular, and one terminal connected to the common terminal is provided on a first end side and another terminal is provided on a second end side in a longitudinal direction in each of the first and second filter elements; and
   the first filter element and the second filter element are provided in the main body such that, regarding the first filter element, the one terminal is arranged on a common terminal side and the other terminal is arranged on a first terminal side, and, regarding the second filter element, the one terminal is arranged on the common terminal side and the other terminal is arranged on a second terminal side.

6. The duplexer according to claim 1, wherein the first filter and the second filter are provided such that a first filter element and a second filter element are arranged next to each other on a substrate in a longitudinal direction of the substrate, one terminal that is common to the first filter element and the second filter element and that is connected to the common terminal is provided in a central portion of the substrate in the longitudinal direction, and other terminals of the first filter element and the second filter element are provided on two end sides of the substrate in the longitudinal direction; and the substrate is provided in the main body such that the one terminal is arranged on a common terminal side and the other terminals are respectively arranged on a first terminal side and a second terminal side.

7. A circuit module comprising:
the duplexer according to claim 1; and
a mounting substrate that mounts the duplexer; wherein
a common electrode connected to the common terminal, a first electrode connected to the first terminal, a second electrode connected to the second terminal, and a ground electrode are provided on the mounting substrate.

8. The circuit module according to claim 7, wherein the ground electrode is planar or substantially planar and extends over a whole surface excluding a portion where the common terminal is provided in plan view.

9. A duplexer comprising:
a first filter and a second filter with different frequency bands;
a main body including a back surface;
a common terminal mounted on the back surface of the main body and connected to one of an input side and an output side of the first filter and to one of an input side and an output side of the second filter;
a first terminal mounted on the back surface of the main body and connected to another side of the first filter that is not connected to the common terminal; and
two second terminals mounted on the back surface of the main body and connected to another side of the second filter that is not connected to the common terminal; wherein
the common terminal is arranged in a central portion of the back surface;
the first terminal is arranged on a virtual line that passes through the common terminal and that is parallel or substantially parallel with one side of the back surface of the main body and the second terminals are line-symmetrical about the virtual line with the common terminal being sandwiched between the second terminals;
a first filter element of the first filter and a second filter element of the second filter are rectangular or substantially rectangular, and one terminal connected to the common terminal is provided on a first end side and another terminal is provided on a second end side in a longitudinal direction in each of the first and second filter elements; and
the first filter element and the second filter element are provided in the main body such that, regarding the first filter element, the one terminal is arranged on a common terminal side and the other terminal is arranged on a first terminal side, and, regarding the second filter element, the one terminal is arranged on the common terminal side and the other terminal is arranged on a second terminal side.

10. The duplexer according to claim 9, wherein
a plurality of ground terminals are provided on the back surface; and
the ground terminals are arranged between the common terminal and the first terminal and between the common terminal and at least one of the two second terminals.

11. The duplexer according to claim 10, wherein the ground terminals have a larger area than the common terminal, the first terminal, and the two second terminals.

12. The duplexer according to claim 9, wherein
the first filter element and the second filter element are arranged next to each other on a substrate in a longitudinal direction of the substrate, the one terminal of each of the first filter element and the second filter element is provided in a central portion of the substrate in the longitudinal direction, and the another terminals of the first filter element and the second filter element are provided on two end sides of the substrate in the longitudinal direction; and the substrate is provided in the main body such that the one terminal is arranged on a common terminal side and the another terminals are respectively arranged on a first terminal side and a second terminal side.

13. A circuit module comprising:
the duplexer according to claim 9; and
a mounting substrate that mounts the duplexer; wherein
a common electrode connected to the common terminal, a first electrode connected to the first terminal, a second electrode connected to the second terminal, and a ground electrode are provided on the mounting substrate.

14. The circuit module according to claim 13, wherein the ground electrode is planar or substantially planar and extends over a whole surface excluding a portion where the common terminal is provided in plan view.

15. A duplexer comprising:
a first filter and a second filter with different frequency bands;
a main body including a back surface;
a common terminal mounted on the back surface of the main body and connected to one of an input side and an output side of the first filter and to one of an input side and an output side of the second filter;
two first terminals mounted on the back surface of the main body and connected to another side of the first filter that is not connected to the common terminal; and
two second terminals mounted on the back surface of the main body and connected to another side of the second filter that is not connected to the common terminal; wherein
the common terminal is arranged in a central portion of the back surface;
the first terminals are line-symmetrical about a virtual line that passes through the common terminal and that is parallel or substantially parallel with one side of the back surface of the main body and the common terminal is sandwiched between the first terminals; and
the second terminals are line-symmetrical about the virtual line and the common terminal is sandwiched between the second terminals.

16. A circuit module comprising:
the duplexer according to claim 15; and
a mounting substrate that mounts the duplexer; wherein
a common electrode connected to the common terminal, a first electrode connected to the first terminal, a second electrode connected to one of the second terminals, and a ground electrode are provided on the mounting substrate.

17. The circuit module according to claim 15, wherein the ground electrode is planar or substantially planar and extends over a whole surface excluding a portion where the common terminal is provided in plan view.

* * * * *